US006065976A

United States Patent [19]

Wang

[11] Patent Number: 6,065,976

[45] Date of Patent: May 23, 2000

[54] COAXIAL CABLE CONNECTOR

[76] Inventor: Tsan-Chi Wang, 4th Floor, No. 8, Alley 8, Lane Ssu-Wei, Chung Cheng Rd., Hsin-Tien City, Taipei Hsien, Taiwan

[21] Appl. No.: 09/042,568

[22] Filed: Mar. 17, 1998

[30] Foreign Application Priority Data

Nov. 6, 1997 [TW] Taiwan ................................ 86218668

[51] Int. Cl.[7] ............................ H01R 9/05; H01R 12/00; H05K 1/00

[52] U.S. Cl. ............................................. 439/63; 439/581

[58] Field of Search ................................... 439/188, 578, 439/582, 944, 63, 581

[56] References Cited

U.S. PATENT DOCUMENTS

| | | | |
|---|---|---|---|
| 3,553,607 | 1/1971 | Lehrfeld . | |
| 4,655,534 | 4/1987 | Stursa | 339/177 |
| 4,688,876 | 8/1987 | Morelli | 439/578 |
| 4,688,877 | 8/1987 | Dreyer | 439/584 |
| 4,797,121 | 1/1989 | Hayward | 439/579 |
| 5,167,536 | 12/1992 | Wang | 439/620 |
| 5,219,299 | 6/1993 | Wang | 439/188 |
| 5,404,117 | 4/1995 | Walz | 333/34 |
| 5,490,033 | 2/1996 | Cronin | 361/212 |
| 5,509,818 | 4/1996 | Lai | 439/188 |
| 5,532,659 | 7/1996 | Dodart | 333/260 |
| 5,613,859 | 3/1997 | Bellantoni et al. | 439/63 |

*Primary Examiner*—Neil Abrams
*Assistant Examiner*—Chandrika Prasad
*Attorney, Agent, or Firm*—Birch, Stewart, Kolasch & Birch, LLP

[57] ABSTRACT

A coaxial cable connector which includes a metal shell, an insulator unit, and a signal transmission unit mounted within the metal shell and electrically insulated from it by the insulator unit, the coaxial cable connector being functionally divided into a first coupling unit having longitudinal notches adapted for fastening to a printed circuit board (for example, a network card), and a second coupling unit adapted for coupling to an external coaxial cable connector.

19 Claims, 6 Drawing Sheets

COAXIAL CABLE CONNECTOR

BACKGROUND OF THE INVENTION

The present invention relates to coaxial cable connectors, and more particularly to such a coaxial cable connector which can be made in the form of a BNC type or TNC type connector for use in a computer network system.

In computer or electronic industry, electronic devices are made as small as possible so that installation space can be minimized. However, electronic devices must be made standardized to meet market requirements. A regular coaxial cable connector for connection between a coaxial cable and a printed circuit board is generally comprised of a signal terminal and a grounding terminal. When a coaxial cable connector is installed in a printed circuit board, its signal terminal and grounding terminal are respectively soldered to signal terminal and grounding terminal on the printed circuit board. Because the signal terminal and grounding terminal of the coaxial cable connector are directly soldered to the signal terminal and grounding terminal on the printed circuit board, the connections between the coaxial cable connector and the printed circuit board tend to be damaged if the coaxial cable connector is stretched during the installation of an external electrical connector of a computer network system or its removal from the coaxial cable connector.

SUMMARY OF THE INVENTION

It is one object of the present invention to provide a coaxial cable connector which requires less installation space. It is another object of the present invention to provide a coaxial cable connector which can be quickly installed in a printed circuit board. It is still another object of the present invention to provide a coaxial cable connector which is inexpensive to manufacture. According to one aspect of the present invention, the coaxial cable connector comprises a hollow metal shell, a signal transmission unit mounted inside the hollow metal shell for signal transmission, and an insulator unit mounted around the signal transmission unit within the hollow metal shell and adapted to electrically insulate the signal transmission unit from the hollow metal shell. According to another aspect of the present invention, the coaxial cable connector being functionally divided into a first coupling unit having longitudinal notches adapted for fastening to a printed circuit board (for example, a network card), and a second coupling unit adapted for coupling to an external coaxial cable connector. According to still another aspect of the present invention, the signal transmission mechanism provides noise eliminating and auto termination functions at the second coupling unit. According to one embodiment of the present invention, the coaxial cable connector has a T-shaped profile. According to another embodiment of the present invention, the coaxial cable connector has a cylindrical profile.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
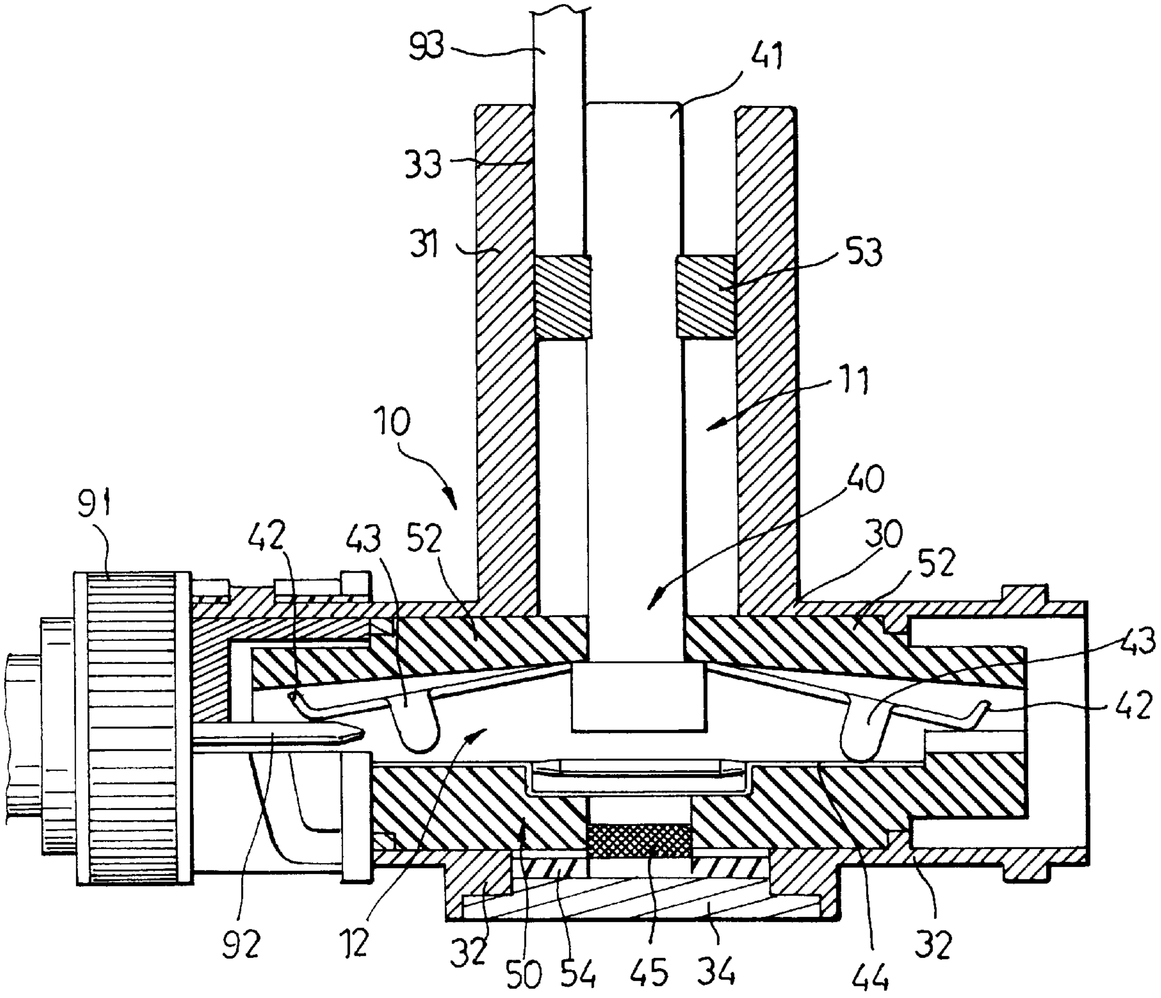
FIG. 1 is a sectional view of a coaxial cable connector according to a first embodiment of the present invention.

Referring to FIGS. from 1 to 3, a coaxial cable connector 10 in accordance with a first embodiment of the present invention has a substantially T-shaped profile. The outer shell of the coaxial cable connector 10 is a hollow metal shell 30. The coaxial cable connector 10 is functionally divided into a first coupling unit 11, and a second coupling unit 12. The metal shell 30 comprises a tubular first shell half 31 disposed at the first coupling unit 11, and a tubular second shell half 32 disposed at the second coupling unit 12. The second shell half 32 is integral with the first shell half 31. According to this embodiment, the first shell half 31 perpendicularly extends from the second shell half 32 on the middle, therefore the metal shell 30 has a substantially T-shaped profile.

A signal transmission unit 40 and an insulator unit 50 are provided inside the metal shell 30. The signal transmission unit 40 is adapted to transmit signal in the computer network system. The insulator unit 50 is adapted to electrically insulate the signal transmission unit 40 from the metal shell 30. According to the first embodiment of the present invention, the signal transmission unit 40 comprises spring strips 43, metal contact plates 44 and ceramic resistors in an electrically insulative tube 52 of the insulator unit 50 inside the second coupling unit 12. This design enables the signal transmission unit 40 to achieve noise eliminating and auto-termination functions. The insulator unit 50 further comprises an electrically insulative plate 45 disposed inside the second coupling unit 12 at the bottom. Further, a metal cover plate 34 is covered on a hole (not shown) on the second shell half 32 of the metal shell 30 to hold the electrically insulative plate 45 and the ceramic resistors in place. With respect to the detailed structure and functions of the second coupling unit 12, please refer to U.S. Pat. No. 5,387,116.

The signal transmission unit 40 comprises a cylindrical signal terminal 41 longitudinally mounted in the first coupling unit 11 and electrically insulated from the first shell half 31 by an electrically insulative ring 53. The first shell half 31 of the metal shell 30 at the first coupling unit 11 has two longitudinal notches 33 symmetrically disposed at two opposite sides. The cut line 331 which passes through the longitudinal notches 33 does not touch the signal terminal 41 (see FIG. 3). By means of the longitudinal notches 33, the first coupling unit 11 can be conveniently fastened to a printed circuit board (for example, a network card) 93, permitting signal terminal 41 of the coaxial cable connector 10 to be forced into contact with a signal terminal 932 on the printed circuit board 93, and the first shell half 31 of the metal shell 30 into contact with grounding terminals 931 on the printed circuit board 93. The width of the longitudinal notches 33 is approximately equal to the thickness of the printed circuit board 93, so that the printed circuit board 93 can be firmly retained to the coaxial cable connector 10 with one side edge of the printed circuit board 93 inserted into the longitudinal notches 33 on the first coupling unit 11. After installation, the grounding terminals 931 of the printed circuit board 93 are soldered to the first shell half 31 of the metal shell 30 at the longitudinal notches 33.

Figure 2:
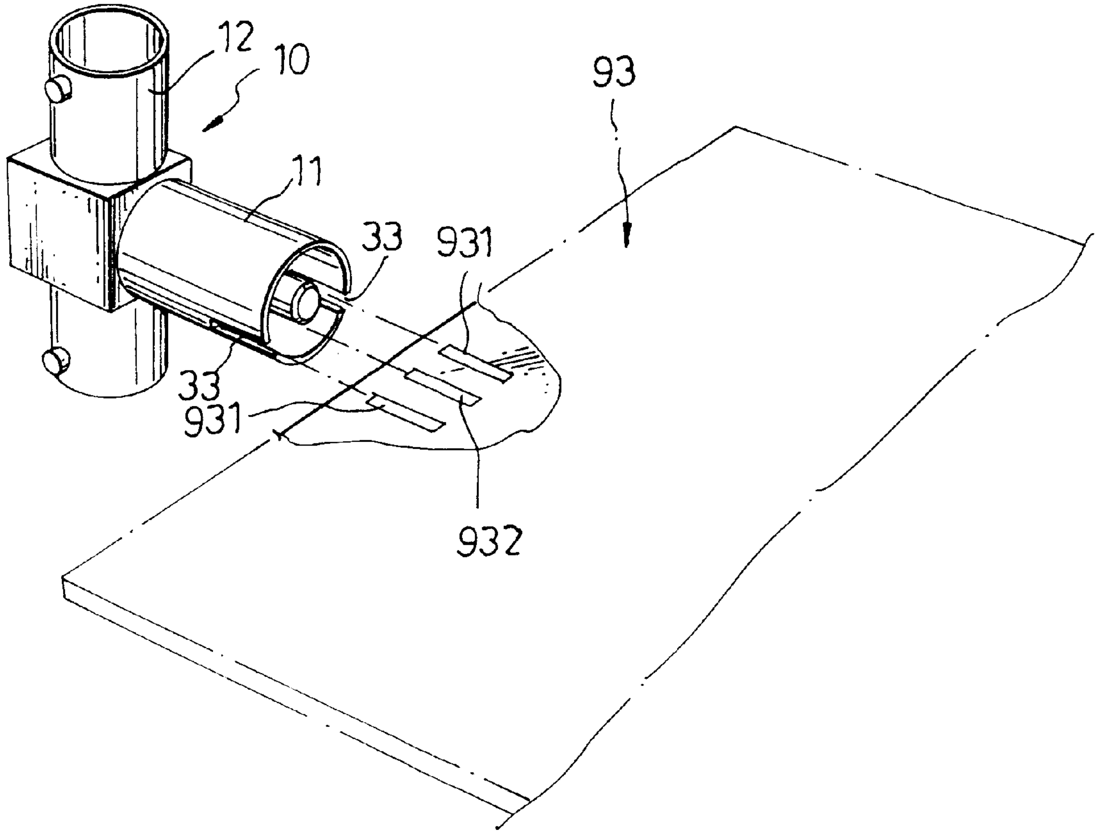
FIG. 2 shows the relationship between the coaxial cable connector of the first embodiment of the present invention and a printed circuit board.

As indicated above, the first coupling unit 11 of the coaxial cable connector 10 is adapted for coupling to the printed circuit board 93 (see FIG. 2), the second coupling unit 12 of the coaxial cable connector 10 is adapted to receive an external coaxial cable connector 91 at each end (see FIG. 1). The signal transmission unit 40 has a part suspended inside the second coupling unit 12 which comprises two female signal terminals 42 respectively connected to the signal terminal 41 in the first coupling unit 11. When an external coaxial cable connector 91 is fastened to one end of the second coupling unit 12, the signal terminal 92 of the external coaxial cable connector 91 is forced into contact with one female signal terminal 42.

Figure 4:
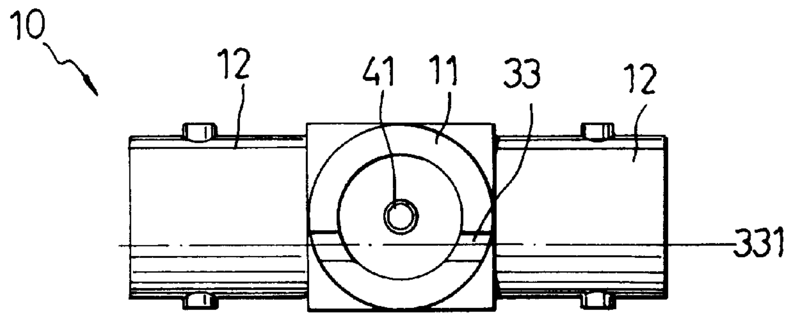
FIG. 4 is a top plain view of a coaxial cable connector according to a second embodiment of the present invention.

FIG. 4 is a top view of a coaxial cable connector according to a second embodiment of the present invention. This embodiment is similar to the aforesaid first embodiment, except for locations of the longitudinal notches 33 at the first coupling unit 11. According to this embodiment, the cut line 331 which passes through the longitudinal notches 33 is disposed in parallel to the second coupling unit 12.

Figure 5:
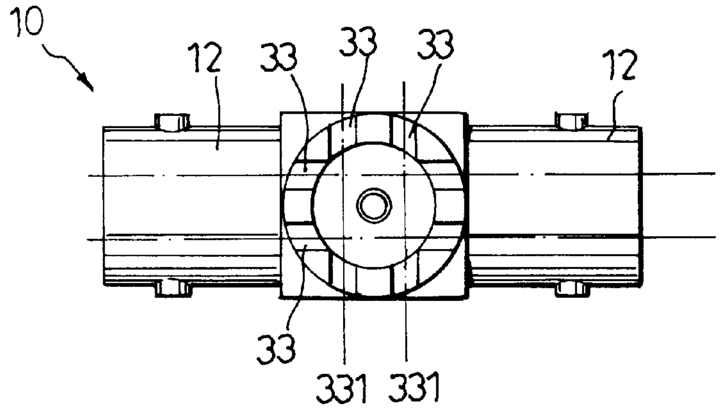
FIG. 5 is a top plain view of a coaxial cable connector according to a third embodiment of the present invention.

FIG. 5 is a top view of a coaxial cable connector according to a third embodiment of the present invention, in which four pairs of longitudinal notches 33 are provided at the first coupling unit for permitting the coaxial cable connector to be fastened to a printed circuit board at any of four positions.

Figure 3:
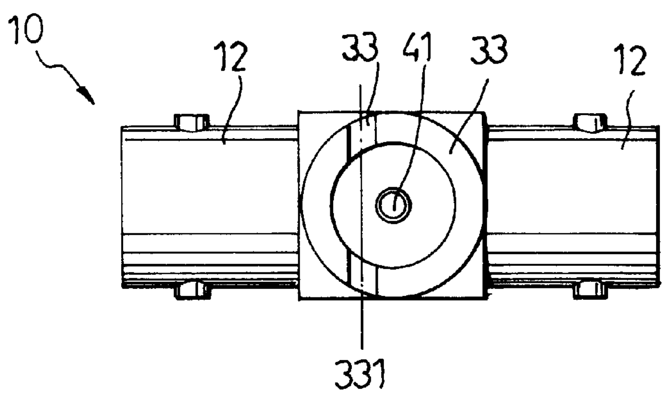
FIG. 3 is a top plain view of the first embodiment of the present invention.

FIGS. 3 to 5 show that the longitudinal notches are arranged in pairs for permitting one pair of longitudinal notches to be coupled to the printed circuit board 93, and the design of the number and locations of the longitudinal notches can be changed as desired.

Figure 6:
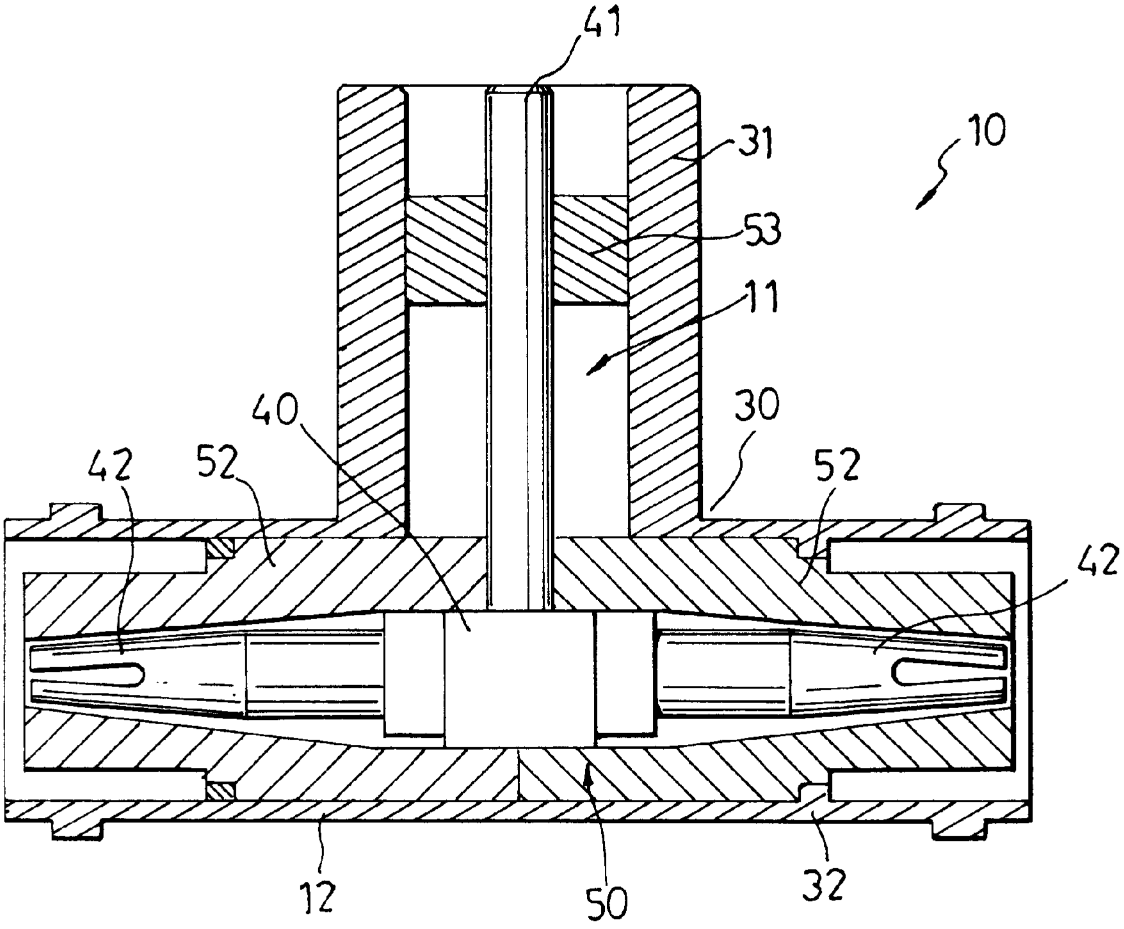
FIG. 6 is a sectional view of a coaxial cable connector according to a fourth embodiment of the present invention.

FIG. 6 is a sectional view of a coaxial cable connector according to a fourth embodiment of the present invention, in which the female signal terminals 42 of the signal transmission unit 40 which are mounted in the second coupling unit 12 do not provide noise eliminating and auto termination functions. Same as the aforesaid embodiments, the design of the number and locations of the longitudinal notches 33 can be changed as desired.

Figure 7:
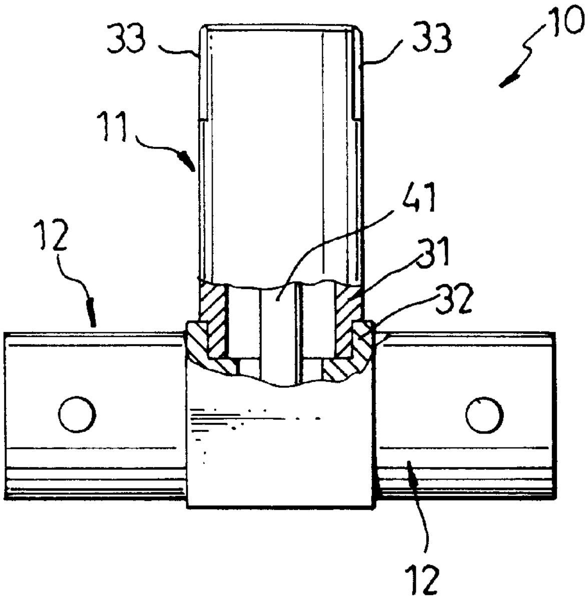
FIG. 7 is a cutaway view of a coaxial cable connector according to a fifth embodiment of the present invention.

FIG. 7 is a cutaway view of a coaxial cable connector according to a fifth embodiment of the present invention, in which the first shell half 31 and the second shell half 32 are separated fabricated and then fastened together.

Figure 8:
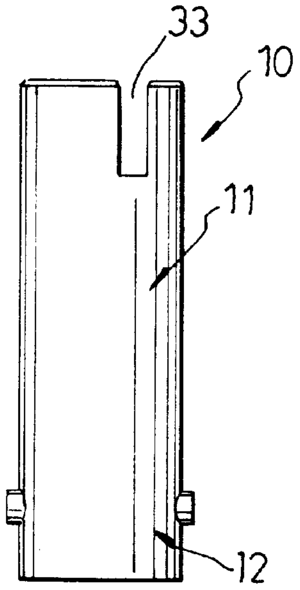
FIG. 8 is a perspective view of a coaxial cable connector according to a sixth embodiment of the present invention.
Figure 9:
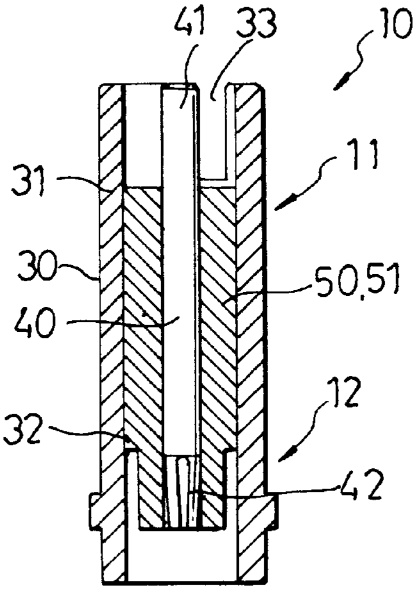
FIG. 9 is a sectional view of the coaxial cable connector according to the sixth embodiment of the present invention.

FIGS. 8 and 9 show a coaxial cable connector according to a sixth embodiment of the present invention, in which the first shell half 31 and the second shell half 32 are axially connected in line i.e. the coaxial cable connector 10 has a hollow cylindrical shape, the insulator unit 50 comprises simply an electrically insulative tube 51 mounted within the hollow metal shell 30 around the signal transmission unit 40; the signal transmission unit 40 comprises a cylindrical signal terminal 41 disposed at the first coupling unit 11, and a female signal terminal 42 disposed at the second coupling unit 12.

Figure 10:
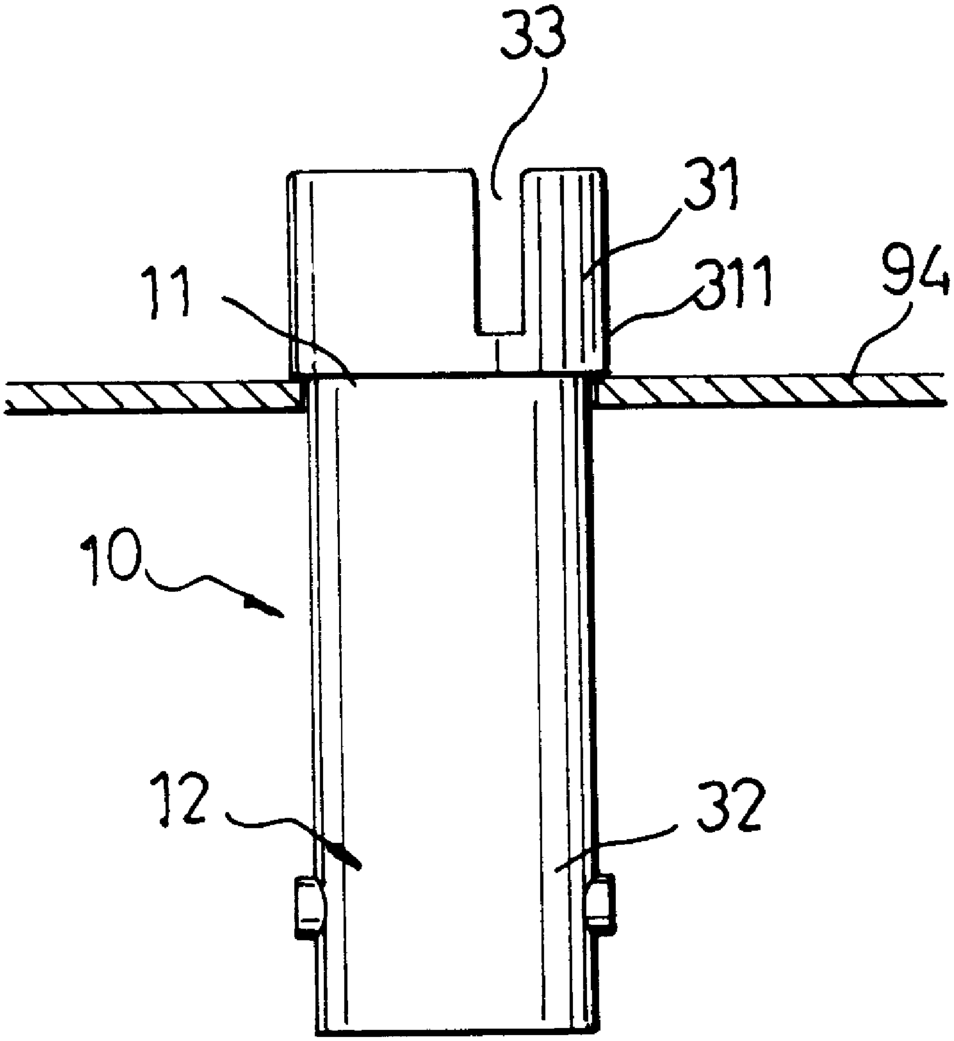
FIG. 10 shows a coaxial cable connector mounted in a panel according to a seventh embodiment of the present invention.

FIG. 10 shows a coaxial cable connector according to a seventh embodiment of the present invention, in which the first shell half 31 has an expanded outer end 311. When the second shell half 32 is inserted through a hole (not shown) on a panel 94 at one side of the printed circuit board to which the first shell half 31 is fastened, the expanded outer end 311 of the first shell half 31 is stopped against an inner side of the panel 94, and therefore the coaxial cable connector 10 is firmly secured in place.

It is to be understood that the drawings are designed for purposes of illustration only, and are not intended as a definition of the limits and scope of the invention disclosed.

What the invention claimed is:

1. A coaxial cable connector comprising a hollow metal shell, a signal transmission unit mounted inside said hollow metal shell for signal transmission, and an electrically insulative unit mounted within said hollow metal shell around said signal transmission unit, wherein the coaxial cable connector is divided into a first coupling unit and a second coupling unit adapted for receiving an external coaxial cable connector at one end of a coaxial cable; said hollow metal shell comprises a first shell half having a hollow cylindrical wall forming part of said first coupling unit, said first shell half having at least one pair of aligned longitudinal notches bilaterally formed in said cylindrical wall and extending to an outer open end thereof, a printed circuit board being insertable into the at least one pair of longitudinal notches for connecting said first shell half to grounding terminals on the printed circuit board, a hollow cylindrical second shell half being disposed at said second coupling unit and connected to said first shell half; said signal transmission unit comprises a cylindrical signal terminal suspended in said first coupling unit and insulated from said first shell half by said insulator unit and adapted for connecting to a signal terminal on the printed circuit board.

2. The coaxial cable connector of claim 1, wherein said first shell half and second shell half of said metal shell are axially connected in line.

3. The coaxial cable connector of claim 1, wherein said metal shell is a substantially T-shaped shell having its first shell half perpendicularly connected to its second shell half; said signal transmission unit comprises two female signal terminals respectively suspended in said second coupling unit at two opposite ends and electrically insulated from said second shell half of said metal shell by said insulator unit.

4. The coaxial cable connector of claim 2, wherein said first shell half has an expanded outer end.

5. The coaxial cable connector of claim 2, wherein said insulator unit comprises an electrically insulative tube coaxially mounted within said metal shell around said cylindrical signal terminal of said signal transmission unit.

6. The coaxial cable connector of claim 3, wherein said insulator unit comprises an electrically insulative ring mounted in said first coupling unit around said cylindrical signal terminal within said first shell half.

7. The coaxial cable connector of claim 3, wherein said signal transmission unit provides noise eliminating and auto termination functions at said second coupling unit.

8. The coaxial cable connector of claim 7, wherein said signal transmission unit comprises two female signal terminals disposed in said second coupling unit at two opposite ends and adapted to receive signal from an external coaxial cable connector, at least two springy metal strips respective extended from said female signal terminals, a metal contact plate, ceramic resistors connected between said metal contact plate and said second shell half of said metal shell, said springy metal strips being forced by material spring power thereof into contact with said metal contact plate to automatically terminate the circuit after removable of an external coaxial cable connector from each end of said second coupling unit.

9. The coaxial cable connector of claim 1, wherein said second shell half of said metal shell comprises two pairs of longitudinal notches.

10. The coaxial cable connector of claim 1, wherein said second shell half of said metal shell comprises four pairs of longitudinal notches.

11. The coaxial cable connector of claim 1, wherein the first shell half has its at least one pair of longitudinal notches soldered to grounding terminals on the printed circuit board.

12. The coaxial cable connector of claim 11, wherein the signal terminal on the printed circuit board is between the grounding terminals on the printed circuit board.

13. The coaxial cable connector of claim 1, wherein the first shell half has an exterior wall through which the at least one pair of longitudinal notches extend, the exterior wall of the first shell half remaining exposed when the coaxial cable connector is connected to the printed circuit board.

14. The coaxial cable connector of claim 1, wherein a connection is formable between the printed circuit board and the at least one pair of longitudinal notches such that the printed circuit board and first shell half are mechanically interconnected together.

15. A coaxial cable connector comprising a hollow metal shell, a signal transmission unit mounted inside said hollow metal shell for signal transmission, and an electrically insulative unit mounted within said hollow metal shell around said signal transmission unit, wherein the coaxial cable connector is divided into a first coupling unit and a second coupling unit adapted for receiving an external coaxial cable connector at one end of a coaxial cable; said hollow metal shell comprises a first shell half having a hollow cylindrical wall forming part of said first coupling unit, said first shell half having at least one pair of aligned longitudinal notches bilaterally formed in said cylindrical wall and extending to an outer open end thereof, a printed circuit board being insertable into the at least one pair of longitudinal notches for connecting said first shell half to grounding terminals on the printed circuit board, a hollow cylindrical second shell half being disposed at said second coupling unit and connected to said first shell half; said signal transmission unit comprises a cylindrical signal terminal suspended in said first coupling unit and insulated from said first shell half by said insulator unit and adapted for connecting to a signal terminal on the printed circuit board, wherein said signal terminal does not extend outside said open end of said cylindrical wall of said first shell half.

16. A coaxial cable connector comprising:

a hollow metal shell;

a signal transmission unit mounted inside said hollow metal shell for signal transmission; and an electrically insulating unit mounted within said hollow metal shell around said signal transmission unit, wherein:

said hollow metal shell is divided into a first coupling unit and a second coupling unit adapted for receiving an external coaxial cable connector at one end of a coaxial cable; and said first coupling unit includes a first hollow shell, said first hollow shell has a cylindrical outer wall with an open end, at least one pair of aligned longitudinal notches extending from said open end into said cylindrical outer wall for accepting a printed circuit board to be inserted into said at least one pair of longitudinal notches so that grounding terminals on the printed circuit board are connected to said cylindrical outer wall.

17. The coaxial cable connector of claim 16, wherein said first coupling unit further includes a cylindrical signal terminal located inside said cylindrical outer wall, said cylindrical signal terminal being a part of said signal transmission unit.

18. The coaxial cable connector of claim 17, wherein an alignment line which passes through said at least one pair of aligned longitudinal notches passes adjacent to a side of said cylindrical signal terminal.

19. The coaxial cable connector of claim 18, wherein said cylindrical signal terminal is adapted for connecting to a signal terminal on the printed circuit board.

* * * * *